(12) United States Patent
Janakiraman et al.

(10) Patent No.: US 6,830,624 B2
(45) Date of Patent: Dec. 14, 2004

(54) BLOCKER PLATE BY-PASS FOR REMOTE PLASMA CLEAN

(75) Inventors: Karthik Janakiraman, San Jose, CA (US); Edwin C. Suarez, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/429,022

(22) Filed: May 2, 2003

(65) Prior Publication Data

US 2004/0216844 A1 Nov. 4, 2004

(51) Int. Cl.[7] .............................................. H01L 21/00
(52) U.S. Cl. ................... 118/715; 118/719; 118/723 E; 438/758; 438/680
(58) Field of Search ................ 118/715, 719, 118/723 E; 438/680, 758

(56) References Cited

U.S. PATENT DOCUMENTS

| | | | |
|---|---|---|---|
| 5,000,113 A | | 3/1991 | Wang et al. |
| 5,403,434 A | | 4/1995 | Moslehi |
| 6,090,210 A | * | 7/2000 | Balance et al. ............. 118/725 |
| 6,139,923 A | * | 10/2000 | Gupta ......................... 427/579 |
| 6,228,208 B1 | | 5/2001 | Lill et al. |
| 6,329,297 B1 | | 12/2001 | Balish et al. |
| 6,364,954 B2 | * | 4/2002 | Umotoy et al. ............. 118/715 |
| 6,387,207 B1 | | 5/2002 | Janakiraman |
| 6,495,233 B1 | * | 12/2002 | Shmurun et al. ........... 428/64.1 |
| 2003/0019428 A1 | * | 1/2003 | Ku et al. ..................... 118/715 |
| 2003/0140851 A1 | * | 7/2003 | Janakiraman et al. ....... 118/715 |

FOREIGN PATENT DOCUMENTS

| | | |
|---|---|---|
| EP | 0843339 A2 | 5/1998 |
| EP | 0874386 A2 | 10/1998 |
| WO | WO 02/04691 A2 | 1/2002 |

* cited by examiner

Primary Examiner—Alexander Ghyka
(74) Attorney, Agent, or Firm—Townsend & Townsend & Crew

(57) ABSTRACT

A flow of a remotely-generated plasma to a processing chamber by-passes a blocker plate and thereby avoids unwanted recombination of active species. By-passing the blocker plate according to embodiments of the present invention avoids the high pressures arising upstream of the blocker plate, inhibiting ion recombination and elevating the concentration of reactive ions available in the processing chamber for cleaning and other reactions. In accordance with one embodiment of the present invention, the flowed ions may be distributed beyond the edge of an underlying blocker plate through channels of a separate by-pass plate positioned between the gas box and the blocker plate. In accordance with an alternative embodiment in accordance with the present invention, the flow of remotely generated active ion species may be distributed beyond the edge of an underlying blocker plate through channels of the gas box itself.

17 Claims, 12 Drawing Sheets

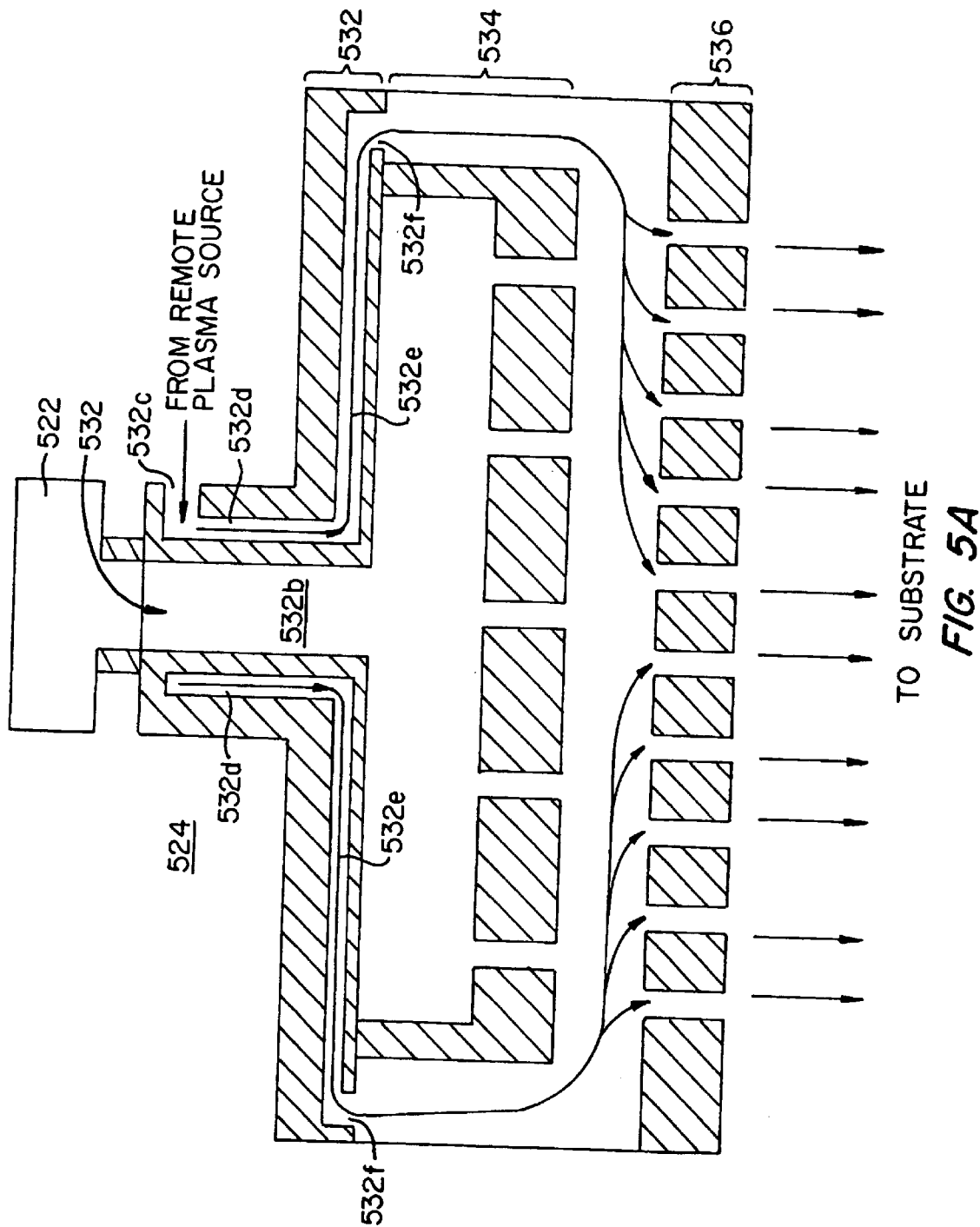

BLOCKER PLATE BY-PASS FOR REMOTE PLASMA CLEAN

BACKGROUND OF THE INVENTION

The invention relates generally to apparatus for substrate processing and, more particularly, to a structure allowing remote plasma clean gases to by-pass a blocker plate.

The fabrication of semiconductor products, such as integrated circuits, often involves the formation of layers on a substrate, such as a silicon wafer. Various techniques have been developed for the deposition processes, as the layers often involve different materials. For example, a metal layer might be deposited and patterned to form conductive interconnects, or a dielectric layer might be formed to electrically insulate one conductive layer from another. Some types of layer formation processes that have been used to form layers of dielectric materials and other materials are chemical vapor deposition (CVD) processes.

CVD processes include thermal deposition processes, in which precursor gases or vapors react in response to the heated surface of the substrate, as well as plasma-enhanced CVD ("PECVD") processes, in which electromagnetic energy is applied to at least one precursor gas or vapor to transform the precursor into a more reactive plasma. Forming a plasma can lower the temperature required to form a film, increase the rate of formation, or both. Therefore, plasma-enhanced process are desirable in many applications.

When a layer is formed on a substrate, some material is usually also deposited on the walls of the deposition chamber and other components of the deposition system as residue. The material on the walls of the chamber is generally undesirable because the residue can build up and become a source of particulate contamination, causing wafers to be rejected. Several cleaning procedures have been developed to remove residue from inside the chamber. One type of procedure, known as a "wet-clean" is performed by partially disassembling the deposition chamber and wiping the surfaces down with appropriate cleaning fluids. Other types of cleaning processes utilize a plasma to remove the residue by converting it to a volatile product that can be removed by the chamber exhaust system. These processes are known as "dry" cleans.

There are two general types of plasma dry cleaning processes. One type forms a plasma inside the processing chamber, or "in situ". An example of an in situ plasma clean uses fluorine-containing gases such as $NF_3$, $C_2F_6$, or $C_3F_8$ to form free fluorine for removing residue in the chamber interior.

Another approach to cleaning is to form a plasma in a remote plasma generator and then flow the ions into the processing chamber. Such a remote plasma cleaning process offers several advantages, such as providing a dry clean capability to a deposition system that does not have an in situ plasma system. Furthermore, a remote plasma system may be more efficient at converting cleaning plasma precursor gases or vapors into a plasma, and forming the plasma outside the chamber protects the interior of the chamber from potentially undesirable by-products of the plasma formation process, such as plasma heating and sputtering effects.

There are, however, some less advantageous aspects associated with the utilization of remote plasmas. One issue is that the remotely generated plasma may recombine to form less reactive species as the ions are flowed to the chamber. Such unwanted recombination reduces the effective concentration of the ions that are available to react in the chamber.

FIG. 3A is a simplified schematic view of a conventional chemical vapor deposition (CVD) processing system 310. CVD processing system 310 includes walls 312 and lid 314 defining deposition chamber 316 housing substrate support 318. The substrate support member 318 is typically made of a ceramic or aluminum nitride (AlN) and may include a heater such as a resistive heating coil disposed inside the substrate support member, and may also include substrate chucking mechanisms for securely holding a substrate, such as a vacuum chuck or an electrostatic chuck.

Processing gas source 320 is in fluid communication with processing chamber 316 through mixing manifold 322 of gas delivery system 324. Mixing manifold 322 is also in fluid communication with remote plasma generator 326 featuring RF source 328 and gas source 330. Gas delivery system 324 further comprises gas box 332 in fluid communication with mixing manifold 322, blocker plate 334 in fluid communication with gas box 332, and gas distribution face plate 336 in fluid communication with blocker plate 334.

Vacuum exhaust system 338 is connected to a gas outlet or foreline 342 of the chamber 316. The exhaust system 338 includes one or more vacuum pumps 340, such as a turbomolecular pump, connected to exhaust gases from and maintain vacuum levels in the chamber 316. The one or more vacuum pumps 340 are connected to the foreline 342 for exhausting gases through a valve such as a gate valve. One or more cold traps 344 may be disposed on foreline 342 to remove or condense particular gases exhausted from the chamber.

FIG. 3B is a simplified cross-sectional view of the conventional gas distribution system shown in FIG. 3A. Gas distribution system 324 comprises mixing structure 322 configured to receive a flow of gas or remotely-generated plasma. Gas distribution system 324 also comprises gas box 332 having inlet 332a to center bore 332b that is configured to receive a flow of gases or ions from mixing structure 322. Blocker plate 334 having orifices 334a is affixed to the bottom of gas box 332.

Blocker plate 334 is a gas passageway which functions to transform the flow of gases through the relatively narrow conduit of the gas box into a homogenous gas flow over the entire expected surface area of the wafer positioned within the processing chamber. Accordingly, orifices 334a of blocker plate 334 are sized and positioned to create an initial, coarse distribution of flowed ions/gases over the expected substrate surface. Due to the configuration of holes in the blocker plate that are necessary to accomplish this initial coarse distribution, gases passing through the distribution system experience a pressure increase in region 399 immediately upstream of the blocker plate.

Ions or gases flowed through blocker plate 334 are in turn conveyed to gas distribution face plate 336 having orifices 336a. The orifices 336a of gas distribution face plate 336 are designed to accomplish a finer distribution of flowed gases/ ions over the entire surface of the substrate, in order to ensure deposition of a layer of material of even thickness thereon. A larger number of orifices are thus typically present in the gas distribution faceplate than in the blocker plate. Because of the relatively large number of orifices in the faceplate, and because coarse distribution of gas flow has already been accomplished by the blocker plate, the increase in pressure upstream of the gas distribution face plate is relatively small compared with that arising upstream of the blocker plate.

Ions or gases flowed out of gas distribution face plate 336 enter the chamber and are available to participate in chemical reactions occurring therein, for example removal of residue formed on exposed surfaces of the chamber. However, ion recombination promoted by high pressure reduces the effective concentration of ions in the chamber and thus their cleaning effectiveness.

Therefore, there is a need in the art for methods and apparatuses which reduce the recombination of ions in a remotely-generated plasma that is flowed into a semiconductor fabrication chamber for processing.

SUMMARY OF THE INVENTION

A flow of a remotely-generated plasma to a processing chamber by-passes a blocker plate and thereby avoids unwanted recombination of active species. By-passing the blocker plate according to embodiments of the present invention avoids the high pressures arising upstream of the blocker plate, inhibiting ion recombination and elevating the concentration of reactive ions available in the processing chamber for cleaning and other reactions. In accordance with one embodiment of the present invention, the flowed ions may be distributed beyond the edge of an underlying blocker plate through channels of a separate by-pass plate structure positioned between the gas box and the blocker plate. In accordance with an alternative embodiment in accordance with the present invention, the flowed ion may be distributed beyond the edge of an underlying blocker plate through channels present in the gas box itself.

An embodiment in accordance with the present invention of a gas distribution system for a substrate processing chamber comprises a gas distribution faceplate having a first plurality of gas holes adapted to introduce a gas into the substrate processing chamber. A first gas inlet has a cross-sectional area smaller than the surface area of the substrate. A first gas passageway is fluidly coupled to the first gas inlet and to the first plurality of gas holes, the first gas passageway comprising a second plurality of gas holes configured to transform a flow of gas from the first gas inlet into a flow of gas having the cross-section of the surface area of the substrate. The gas distribution system further comprises a second gas inlet and a second gas passageway fluidly coupled to the second gas inlet and to the first plurality of gas holes, wherein the second gas passageway allows gases to flow from the second gas inlet to the first plurality of gas holes, while by-passing the second plurality of holes.

An embodiment of a gas distribution system in accordance with the present invention for a semiconductor fabrication chamber comprises a gas box having a first channel in fluid communication with a processing gas source and a second channel in fluid communication with a remote plasma source. A blocker plate defines a plurality of orifices in fluid communication with the first inlet of the gas box. A gas distribution faceplate defines a plurality of orifices in fluid communication with the orifices of the blocker plate and in fluid communication with a chamber of a processing tool. A by-pass plate is positioned between the gas box and the blocker plate, the by-pass plate having a first channel in fluid communication with the first channel of the gas box and with the blocker plate orifice, the by-pass plate including a second channel in fluid communication with the second gas box channel, the second channel of the by-pass plate in fluid communication with the chamber without passing through the blocker plate orifice.

Another embodiment of a gas distribution system in accordance with the present invention for a semiconductor fabrication chamber comprises, a gas box including a first channel including an outlet and an inlet in fluid communication with a processing gas source, and a second channel including an outlet and an inlet in fluid communication with a remote plasma source. A blocker plate defines a plurality of orifices in fluid communication with the first gas box channel outlet. A gas distribution faceplate defines a plurality of orifices in fluid communication with the orifices of the blocker plate and with the processing chamber.

An embodiment of a method in accordance with the present invention for distributing gas to a semiconductor processing chamber comprises, generating a flow of a processing gas and causing the flow of the processing as to move through an orifice in a blocker plate prior to entering the processing chamber. A flow of a plasma is generated remote from the processing chamber. A flow of remote plasma is caused to by-pass the orifices in the blocker plate before entering the processing chamber.

An embodiment of a method in accordance with the present invention for enhancing a cleaning effectiveness of a plasma generated remote from a processing chamber comprises, causing a flow of the remotely-generated plasma to by-pass a high pressure region upstream of a blocker plate before entering the processing chamber.

A further understanding of embodiments in accordance with the present invention can be made by way of reference to the ensuing detailed description taken in conjunction with the accompanying drawings.

BRIEF DESCRIPTION OF THE DRAWINGS

FIG. 5A is a simplified cross-sectional view of an alternative embodiment of a gas distribution system in accordance with the present invention.

DESCRIPTION OF THE SPECIFIC EMBODIMENTS

A flow of a remotely-generated plasma to a processing chamber by-passes a blocker plate and thereby avoids unwanted recombination of ions in the plasma. By-passing the blocker plate in accordance with embodiments of the present invention reduces the pressure drop experienced by the flowed plasma, inhibiting ion recombination and thereby elevating the concentration of reactive ions available in the processing chamber for cleaning and other reactions. In accordance with one embodiment of the present invention, the flowed ions may be distributed by a separate distribution plate positioned downstream of the gas box. In accordance with another embodiment of the present invention, the flowed ions may be distributed in passageways through the gas box beyond an outer edge of the blocker plate.

A. Blocker Plate By-Pass

As has been previously described, the high pressures encountered in the region immediately upstream of the blocker plate can give rise to unwanted recombination of active ion species utilized for cleaning. Accordingly, embodiments in accordance with the present invention relate to apparatuses and methods wherein a flow of remotely generated cleaning plasma by-passes the blocker plate and thereby avoids this high pressure region.

Figure 4A:
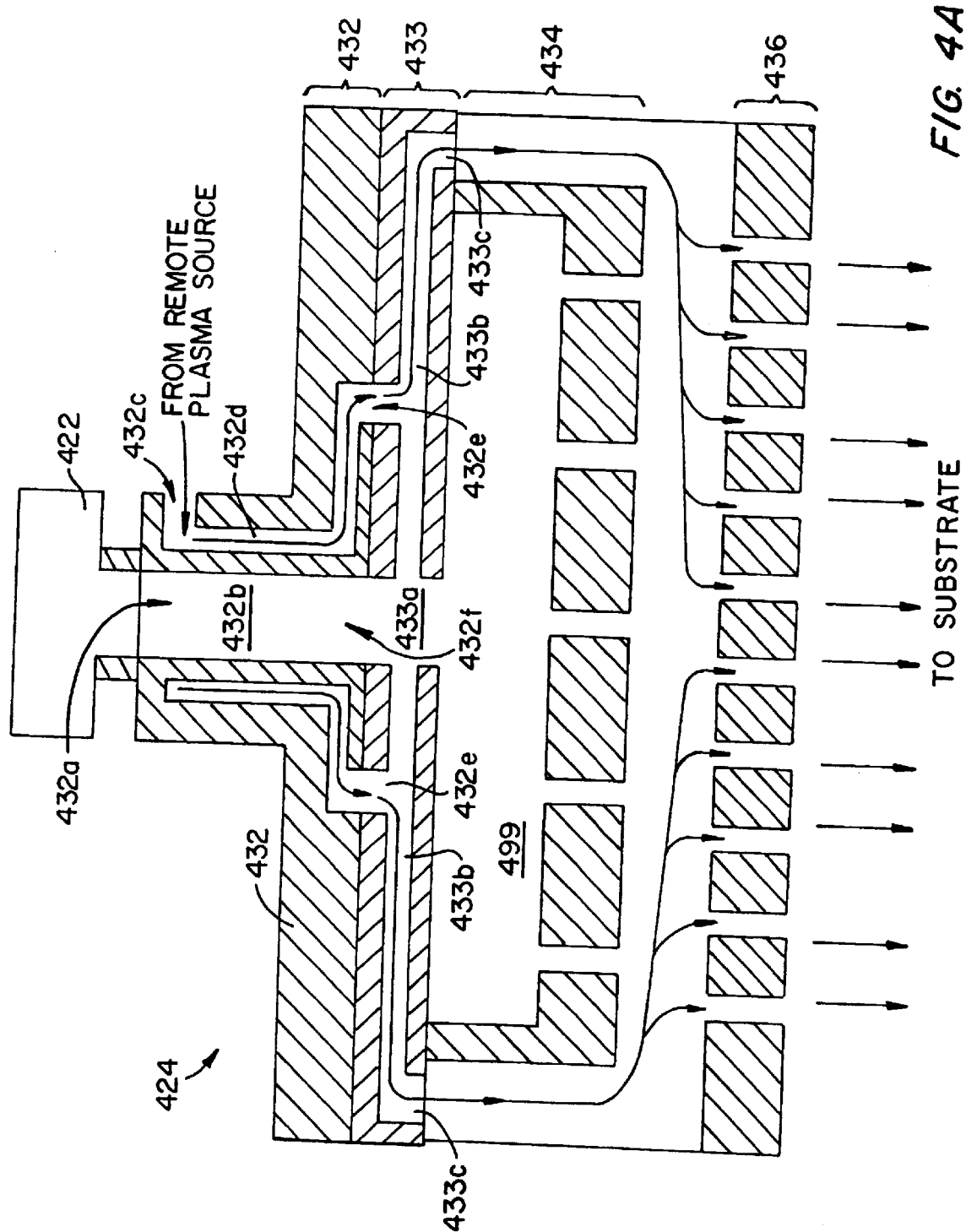
FIG. 4A is a simplified cross-sectional view of an embodiment of a gas distribution system accordance with the present invention.
Figure 4B:
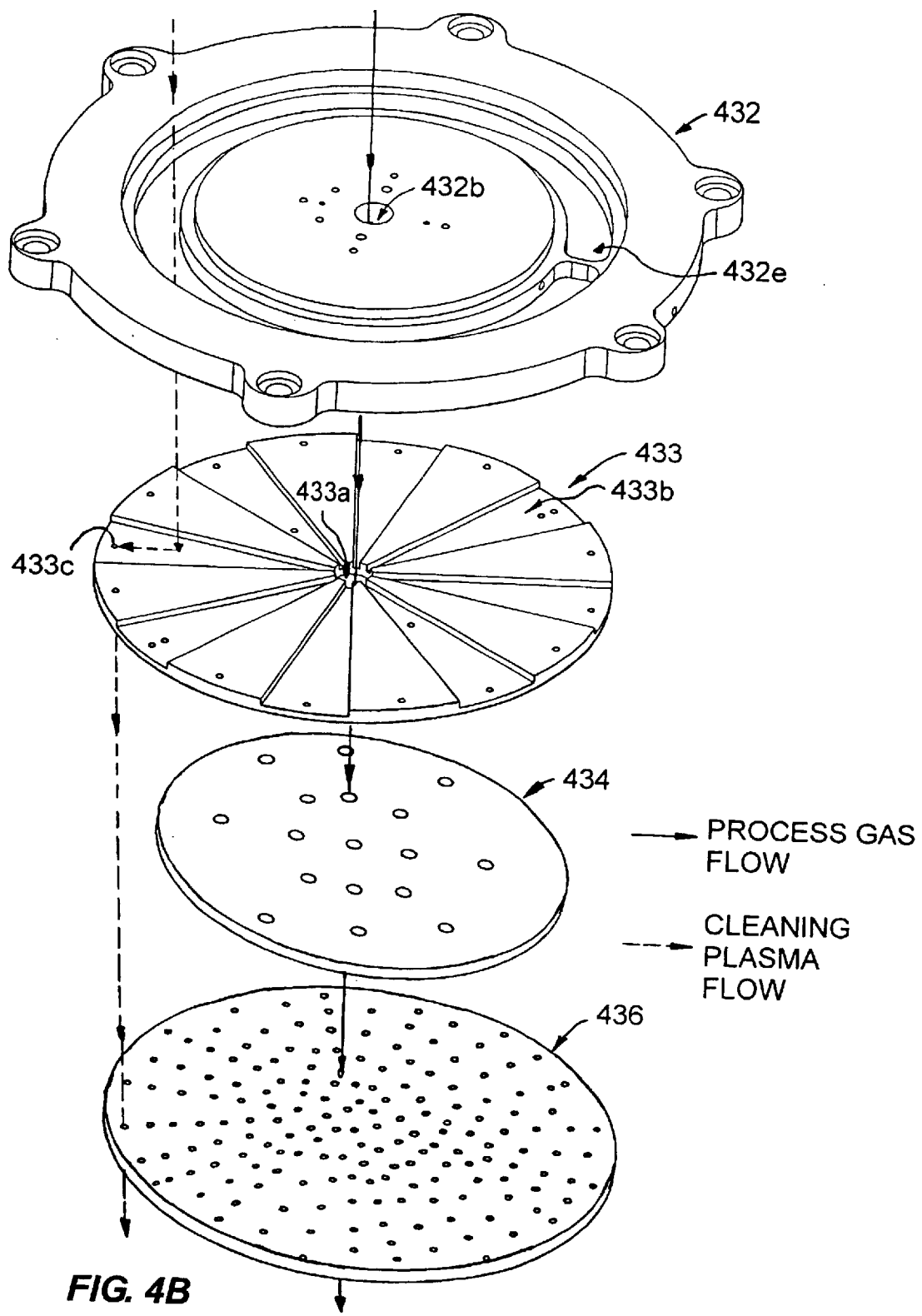
FIG. 4B is an exploded perspective view of the gas distribution system shown in FIG. 4A.

FIG. 4A is a simplified cross-sectional view of an embodiment of a gas distribution system in accordance with the present invention. FIG. 4B is an exploded perspective view of the gas box, by-pass plate, and blocker plate of the embodiment of the gas distribution system shown in FIG. 4A.

Gas distribution system 424 in accordance with an embodiment of the present invention comprises mixing structure 422 configured to receive a flow of gas from a processing gas source. Like the conventional gas distribution structure, the gas box 432 includes inlet 432a to center bore 432b that is configured to receive the flow of processing gas from mixing structure 422. However, gas box 432 also includes secondary inlet 432c that is in fluid communication with annular channel 432d surrounding center bore 432b.

Secondary inlet 432c of gas box 432 is in fluid communication with a remote plasma source. Remote plasma enters secondary inlet 432 and flows through annular channel 432d, exiting the gas box 432 at outlet 432e. Outlet 432e of annular channel 432d surrounds outlet 432f of center bore 432b.

In accordance with one embodiment of the present invention, by-pass plate 433 is positioned beneath gas box 432. By-pass plate 433 includes center bore 433a and spoke-like channels 433b. Spoke-like channels 433b are aligned with outlet 432e of annular channel 432d of gas box 432.

Blocker plate 434 is positioned beneath by-pass plate 433. Blocker plate 434 is a gas passageway that functions to transform the flow of process gas through the narrow center bore of the gas box into a homogenous flow over the entire surface of the substrate that is to be processed within the chamber.

Gas distribution face plate 436 is positioned beneath blocker plate 434. Gas distribution faceplate 436 is a second gas passageway that functions to transform the homogenous flow of process gas from the blocker plate into an extremely uniform flow of gas to the wafer surface, ensuring uniformity of thickness of material deposited thereon. flowed through annular channel 432d is diverted through spoke-like channels 433b away from region 499 immediately upstream of blocker plate 434. This remotely generated plasma flows through peripheral holes 433c to the region upstream of gas distribution face plate 436. Because peripheral holes 433c are not required to create an even distribution of the flow of remotely generated cleaning ions, peripheral holes 433c do not create substantial upstream pressure increase, and thereby avoid ion recombination.

It should be noted that in the embodiment shown in FIG. 4A-B, as particularly evident in FIG. 4B, spoke-like channels 433b of by-pass plate 433 are also in fluid communication with the center bore 433a which passes directly through the by-pass plate. Thus some of the reactive ion species may flow through center bore 433a and blocker plate 434 before reaching the gas distribution face plate 436. However, such flow of the remotely generated plasma through the blocker plate will be inhibited by the build up of pressure upstream, such that the reactive ions will be encouraged to flow through the channels and avoid the blocker plate. This shared fluid communication between the by-pass channels and the center bore is not required by the present invention, and alternative embodiments could utilize mutually exclusive flow pathways.

The above figures illustrate only one particular embodiment of a gas distribution system in accordance with the present invention. The present invention is not limited to this particular example, and other configurations and structure could be employed and remain within the scope of the present invention.

Figure 5B:
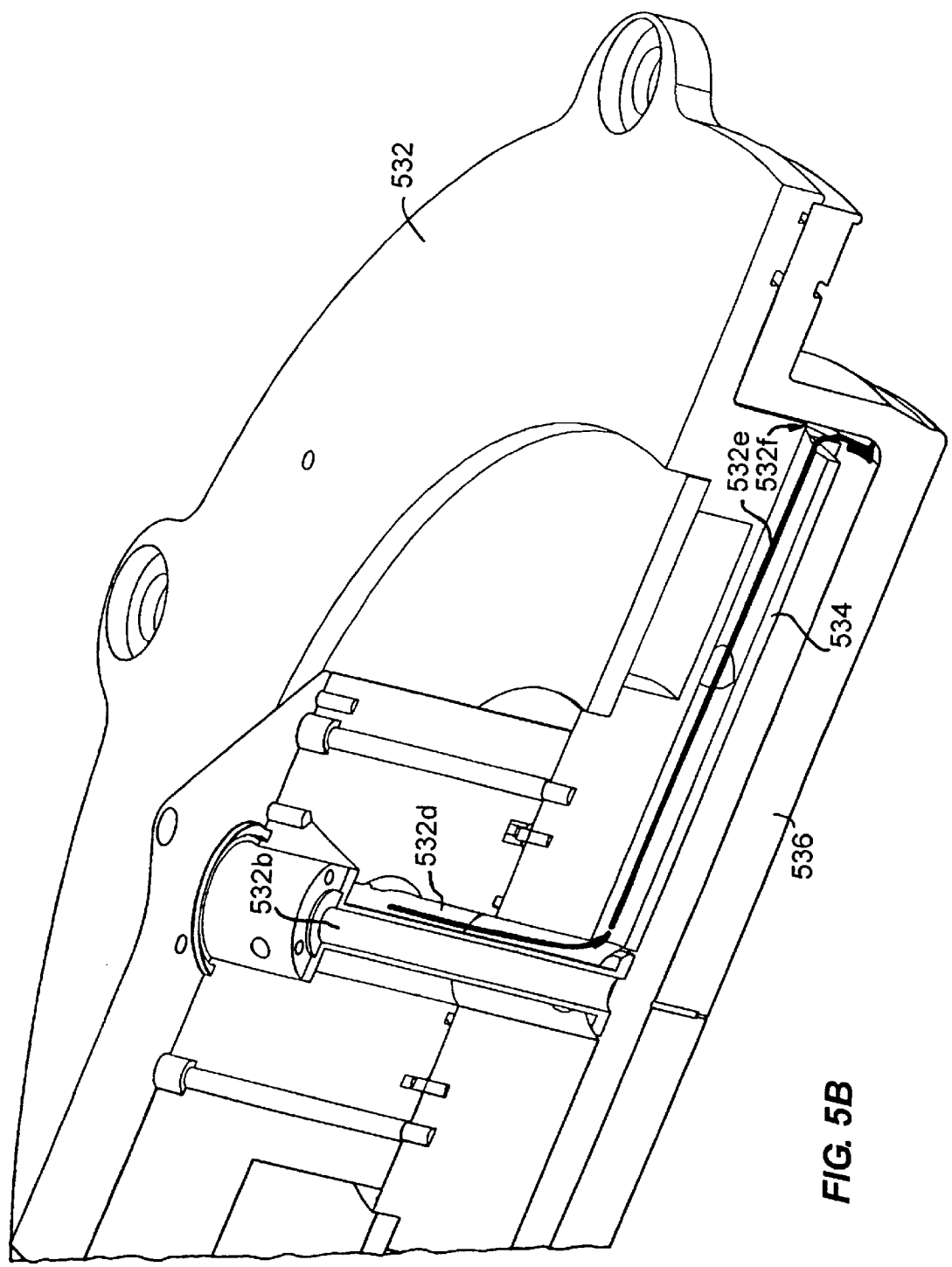
FIG. 5B is a perspective view cross-sectional view of the gas box and blocker plate of the alternative embodiment shown in FIG. 5A.

For example, while the specific embodiment shown in FIG. 4A-B utilizes a separate by-pass plate positioned beneath the gas box, this is not required by the present invention. FIG. 5A is a simplified cross-sectional view of an alternative embodiment of a gas distribution system in accordance with the present invention. FIG. 5B is a perspective view of the gas box and blocker plate of the embodiment shown in FIG. 5A.

Gas distribution system 524 in accordance with an embodiment of the present invention comprises mixing structure 522 configured to receive a flow of gas from a processing gas source. Like the conventional gas distribution structure, the gas box 532 includes inlet 532a to center bore 532b that is configured to receive the flow of processing gas from mixing structure 522. However, gas box 532 also includes secondary inlet 532c that is in fluid communication with annular channel 532d surrounding center bore 532b.

Secondary inlet 532c of gas box 532 is in fluid communication with a remote plasma source. Remote plasma enters secondary inlet 532 and flows through annular channel 532d. Annular channel 532d is in turn in fluid communication with internal channels 532e radiating outward toward the periphery of the gas box. Remotely-generated plasma flowing through the annular channel 532d enters internal channels 532e and is directed outward to the periphery of the gas box 532, exiting the gas box 532 through holes 532f.

Blocker plate 534 is positioned below gas box 532, and gas distribution face plate 536 is positioned below blocker plate 534. Holes 532f are located in the periphery of the lower gas box surface outside of the edge of the blocker plate, and thus feed the flowed remotely generated plasma into the space immediately upstream of the gas distribution face plate 536. The flow of remote plasma by-passes the high pressure region upstream of the blocker plate, suppressing unwanted recombination of active species. And because peripheral holes 532f are not required to create an even distribution of the flow of remotely generated cleaning ions, these peripheral gas box holes 532f do not create substantial upstream pressure increase, again avoiding recombination.

The embodiment shown in FIGS. 5A-B offers the advantage of simplicity, as it eliminates the need to use a separate by-pass plate structure to accomplish diversion in the flow of reactive species around the blocker plate. However, the embodiment shown in FIGS. 5A-B does require separate machining of the radial channels and peripheral holes in the gas box. By contrast, the embodiment shown in FIGS. 4A-B is readily adaptable for use with existing devices, as the by-pass plate need only be placed into position.

The above description and figures relate only to specific examples of apparatuses and methods in accordance with the present invention. Other embodiments may also fall within the scope of the present invention. For example, while the embodiments shown in FIGS. 4A-B and 5A-B flow remotely generated reactive ionic species around the blocker plate to a point upstream of the gas distribution face plate, this is not required by the present invention. Alternative embodiments could cause the flow reactive species to by-pass both the blocker plate and the gas distribution faceplate en route to the processing chamber, and still remain within the scope of the present invention.

B. Process Chamber

A specific example of a CVD system utilizing gas delivery apparatuses and methods in accordance with embodiments of the present invention include the PRODUCER CVD™ chamber/system, available from Applied Materials, Inc. of Santa Clara, Calif.

Figure 1A:
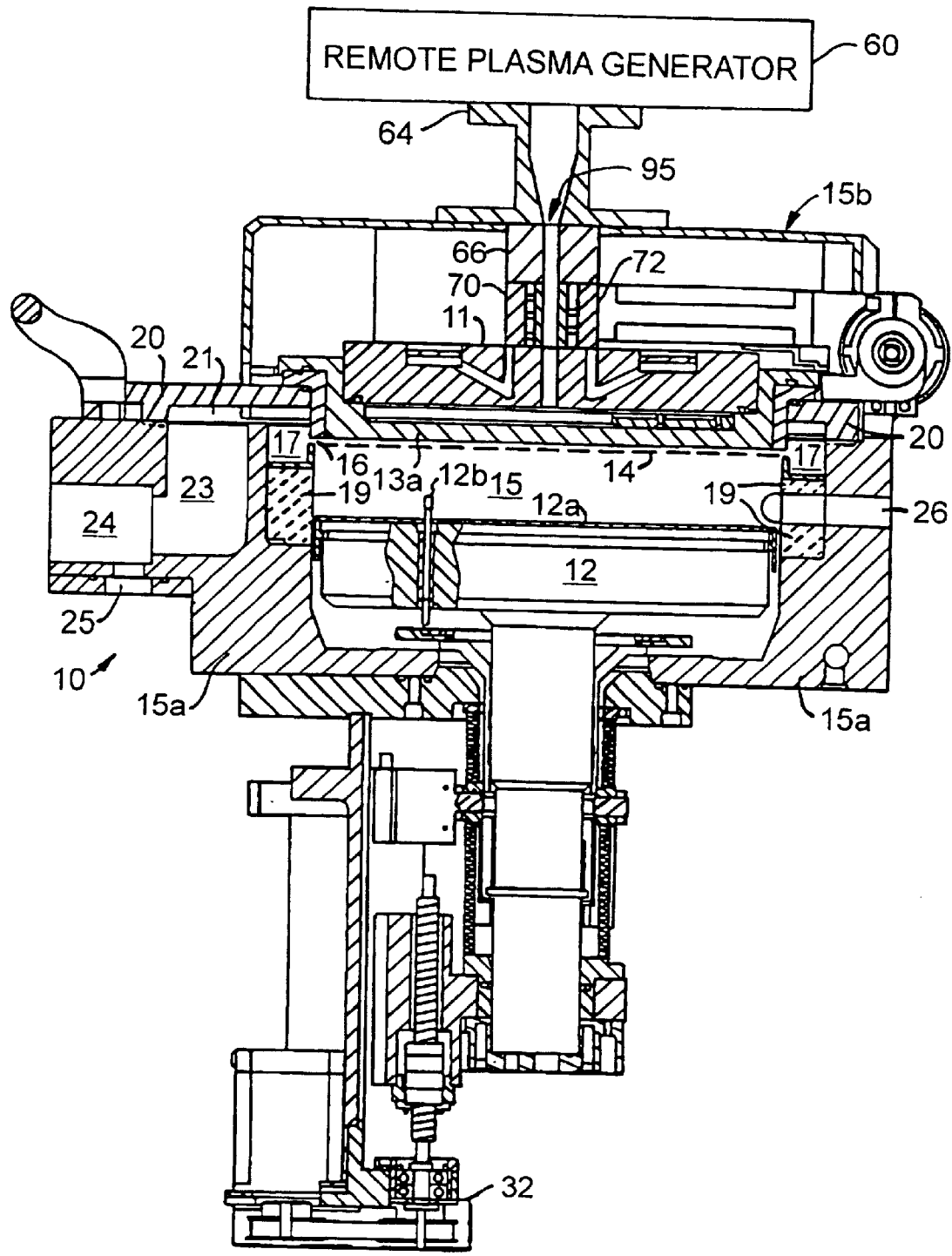
FIGS. 1A and 1B are vertical, cross-sectional views of one embodiment of a chemical vapor deposition apparatus.
Figure 1B:
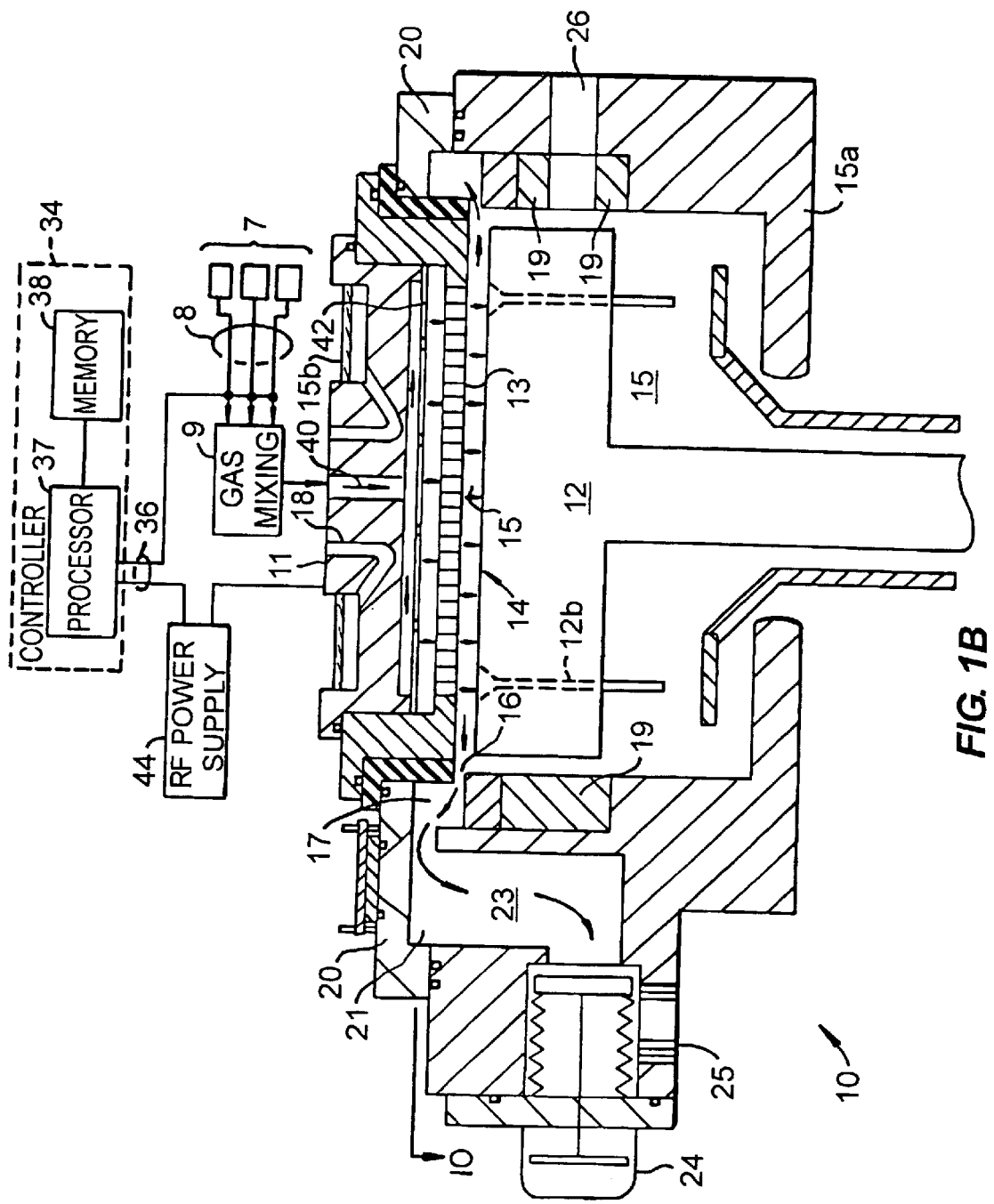
Figure 1C:
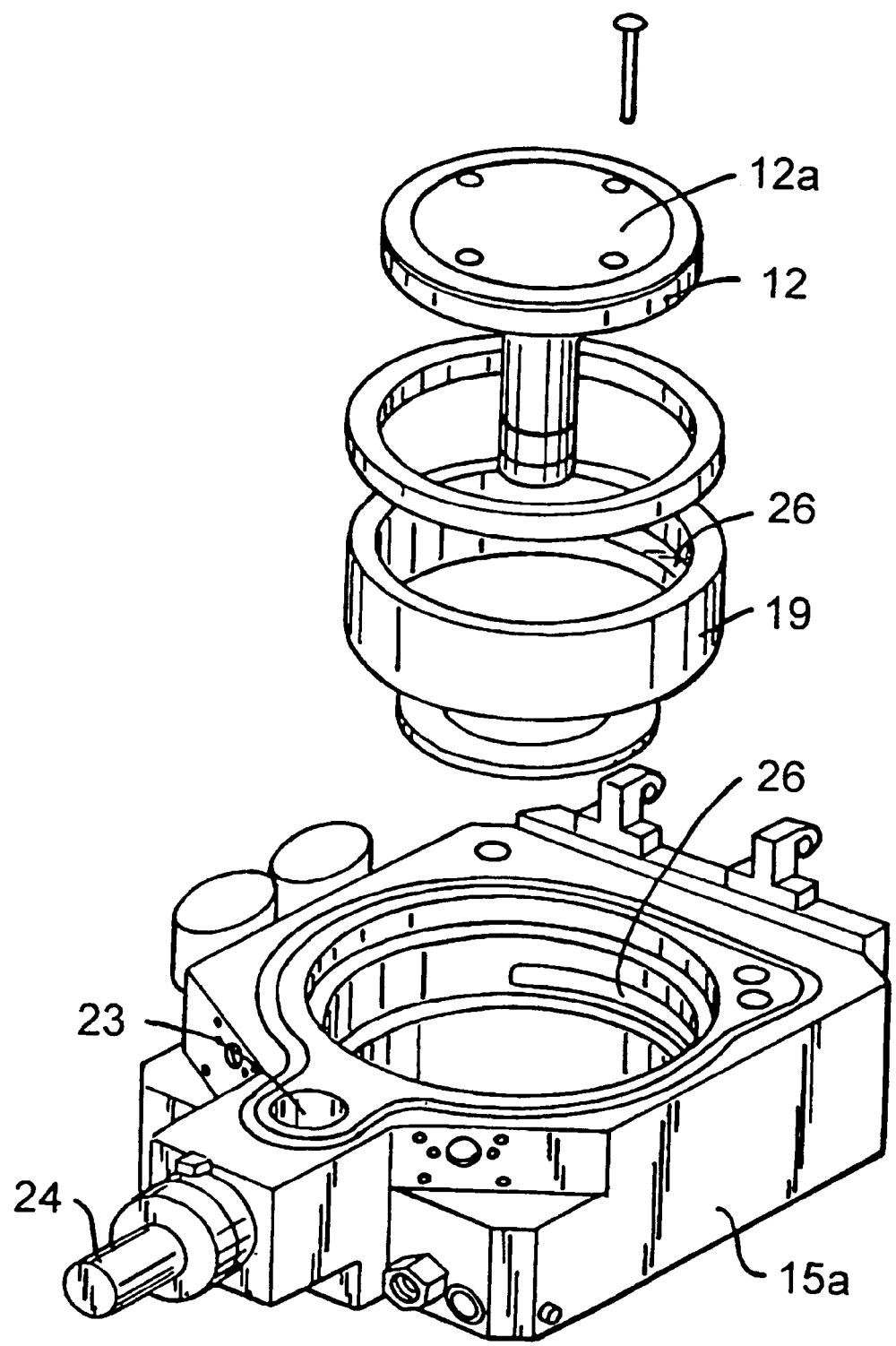
FIGS. 1C and 1D are exploded perspective views of parts of the CVD chamber depicted in FIG. 1A.
Figure 1D:
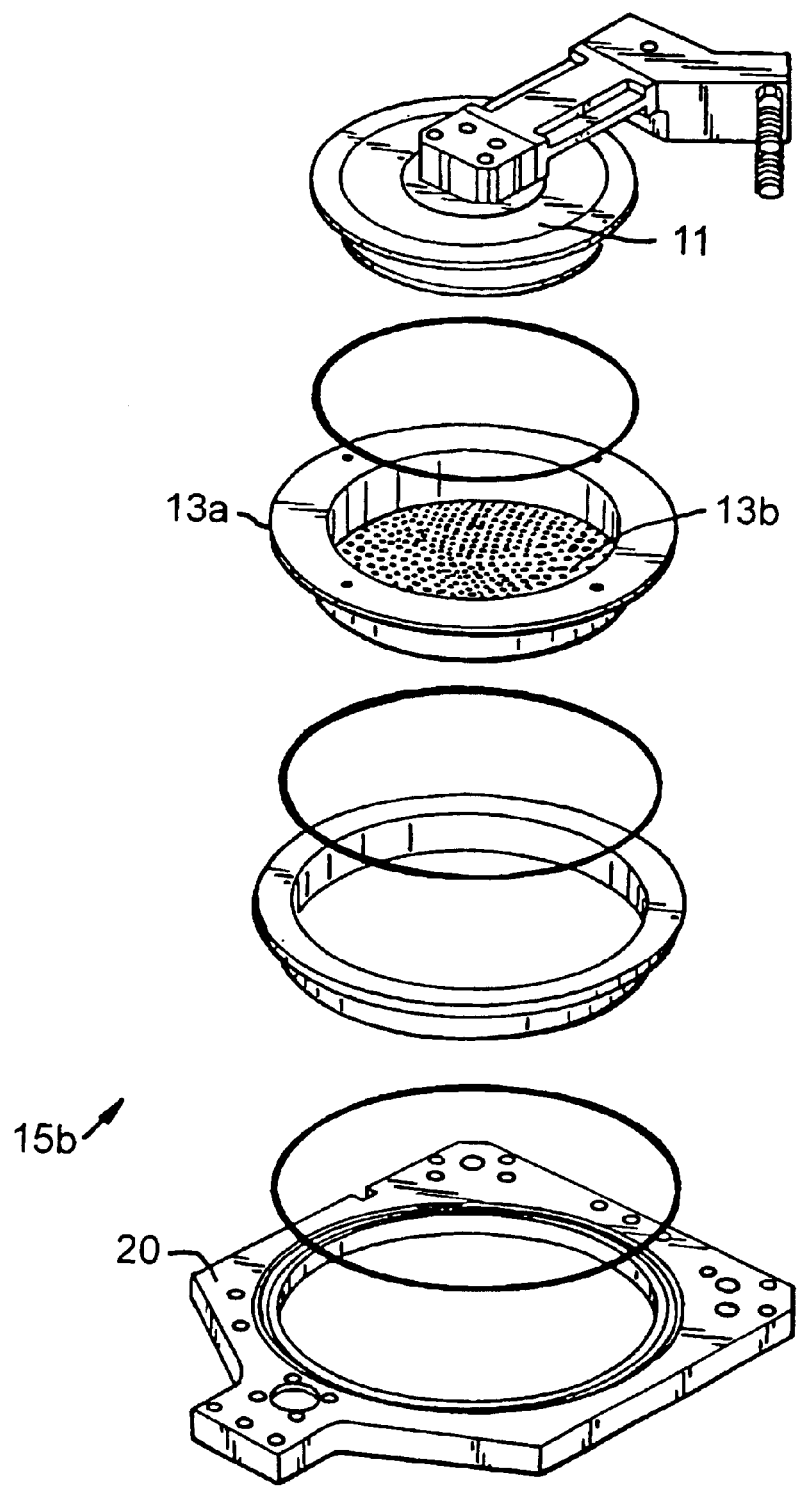

One suitable substrate processing system in which can be modified to utilize embodiments in accordance with the present invention is shown and described in U.S. Pat. No. 6,387,207, incorporated herein by reference for all purposes. FIGS. 1A and 1B are vertical, cross-sectional views of such a CVD system 10, having a vacuum or processing chamber 15 that includes a chamber wall 15a and a chamber lid assembly 15b. The chamber wall 15a and chamber lid assembly 15b are shown in exploded, perspective views in FIGS. 1C and 1D.

The CVD system 10 contains a gas distribution manifold 11 for dispersing process gases to a substrate (not shown) that rests on a heated pedestal 12 centered within the process chamber 15. Gas distribution manifold 11 may be formed from an electrically conducting material in order to serve as an electrode for forming a capacitive plasma. During processing, the substrate (e.g. a semiconductor wafer) is positioned on a flat (or slightly convex) surface 12a of the pedestal 12. The pedestal 12 can be moved controllably between a lower loading/off-loading position (depicted in FIG. 1A) and an upper processing position (indicated by dashed line 14 in FIG. 1A and shown in FIG. 1B), which is closely adjacent to the manifold 11. A centerboard (not shown) includes sensors for providing information on the position of the wafers.

Deposition and carrier gases are introduced into the chamber 15 through perforated holes 13b (FIG. 1D) of a conventional flat, circular gas distribution faceplate 13a. More specifically, deposition process gases flow into the chamber through the inlet manifold 11 (indicated by arrow 40 in FIG. 1B), through a conventional perforated blocker plate 42 and then through holes 13b in gas distribution faceplate 13a.

Before reaching the manifold 11, deposition and carrier gases are input from gas sources 7 through gas supply lines 8 (FIG. 1B) into a mixing system 9 where they are combined and then sent to manifold 11. Generally, the supply line for each process gas includes (i) several safety shut-off valves (not shown) that can be used to automatically or manually shut-off the flow of process gas into the chamber, and (ii) mass flow controllers (also not shown) that measure the flow of gas through the supply line. When toxic gases are used in the process, the several safety shut-off valves are positioned on each gas supply line in conventional configurations.

The deposition process performed in the CVD system 10 can be either a thermal process or a plasma-enhanced process. In a plasma-enhanced process, an RF power supply 44 applies electrical power between the gas distribution faceplate 13a and the pedestal 12 so as to excite the process gas mixture to form a plasma within the cylindrical region between the faceplate 13a and the pedestal 12. (This region will be referred to herein as the "reaction region"). Constituents of the plasma react to deposit a desired film on the surface of the semiconductor wafer supported on pedestal 12. RF power supply 44 is a mixed frequency RF power supply that typically supplies power at a high RF frequency (RF1) of 13.56 MHz and at a low RF frequency (RF2) of 360 KHz to enhance the decomposition of reactive species introduced into the vacuum chamber 15. In a thermal process, the RF power supply 44 would not be utilized, and the process gas mixture thermally reacts to deposit the desired films on the surface of the semiconductor wafer supported on the pedestal 12, which is resistively heated to provide thermal energy for the reaction.

During a plasma-enhanced deposition process, the plasma heats the entire process chamber 10, including the walls of the chamber body 15a surrounding the exhaust passageway 23 and the shut-off valve 24. When the plasma is not turned on or during a thermal deposition process, a hot liquid is circulated through the walls 15a of the process chamber 15 to maintain the chamber at an elevated temperature. A portion of these heat exchanging passages 18 in the lid assembly 15b of chamber 15 is shown in FIG. 1B. The passages in the remainder of the chamber walls 15a are not shown. Fluids used to heat the chamber walls 15a include the typical fluid types, i.e., water-based ethylene glycol or oil-based thermal transfer fluids. This heating (referred to as heating by the "heat exchanger") beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The remainder of the gas mixture that is not deposited in a layer, including reaction byproducts, is evacuated from the chamber 15 by a vacuum pump (not shown). Specifically, the gases are exhausted through an annular, slot-shaped orifice 16 surrounding the reaction region and into an annular exhaust plenum 17. The annular slot 16 and the plenum 17 are defined by the gap between the top of the chamber's cylindrical side wall 15a (including the upper dielectric lining 19 on the wall) and the bottom of the circular chamber lid 20. The 360° circular symmetry and uniformity of the slot orifice 16 and the plenum 17 are important to achieving a uniform flow of process gases over the wafer so as to deposit a uniform film on the wafer.

From the exhaust plenum 17, the gases flow underneath a lateral extension portion 21 of the exhaust plenum 17, past a viewing port (not shown), through a downward-extending gas passage 23, past a vacuum shut-off valve 24 (whose body is integrated with the lower chamber wall 15a), and into the exhaust outlet 25 that connects to the external vacuum pump (not shown) through a foreline (also not shown).

The wafer support platter of the pedestal 12 (preferably aluminum, ceramic, or a combination thereof) is resistively heated using an embedded single-loop embedded heater element configured to make two full turns in the form of parallel concentric circles. An outer portion of the heater element runs adjacent to a perimeter of the support platter, while an inner portion runs on the path of a concentric circle having a smaller radius. The wiring to the heater element passes through the stem of the pedestal 12.

Typically, any or all of the chamber lining, gas inlet manifold faceplate, and various other reactor hardware are made out of material such as aluminum, anodized aluminum, or ceramic. An example of such a CVD apparatus is described in U.S. Pat. No. 5,558,717 entitled "CVD Processing Chamber," issued to Zhao et al. The U.S. Pat. No. 5,558,717 is assigned to Applied Materials, Inc., the assignee of the present invention, and is hereby incorporated by reference in its entirety.

A lift mechanism and motor 32 (FIG. 1A) raises and lowers the heater pedestal assembly 12 and its wafer lift pins 12b as wafers are transferred into and out of the body of the chamber 15 by a robot blade (not shown) through an insertion/removal opening 26 in the side of the chamber 10. The motor 32 raises and lowers pedestal 12 between a processing position 14 and a lower, wafer-loading position. The motor, valves or flow controllers connected to the supply lines 8, gas delivery system, throttle valve, RF power supply 44, and chamber and substrate heating systems are all controlled by a system controller 34 (FIG. 1B) over control lines 36, of which only some are shown. Controller 34 relies on feedback from optical sensors to determine the position of movable mechanical assemblies such as the throttle valve and susceptor which are moved by appropriate motors under the control of controller 34.

In the exemplary embodiment shown in FIG. 1B, the system controller includes a hard disk drive (memory 38), a floppy disk drive and a processor 37. The processor contains a single-board computer (SBC), analog and digital input/output boards, interface boards and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

System controller 34 controls all of the activities of the CVD machine. The system controller executes system control software, which is a computer program stored in a computer-readable medium such as a memory 38. Preferably, the memory 38 is a hard disk drive, but the memory 38 may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to operate controller 34.

A process for depositing a film on a substrate or a process for cleaning the chamber 15 can be implemented using a computer program product that is executed by the controller 34. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Windows™ library routines. To execute the linked, compiled object code the system user invokes the object code, causing the computer system to load the code in memory. The CPU then reads and executes the code to perform the tasks identified in the program.

Figure 1E:
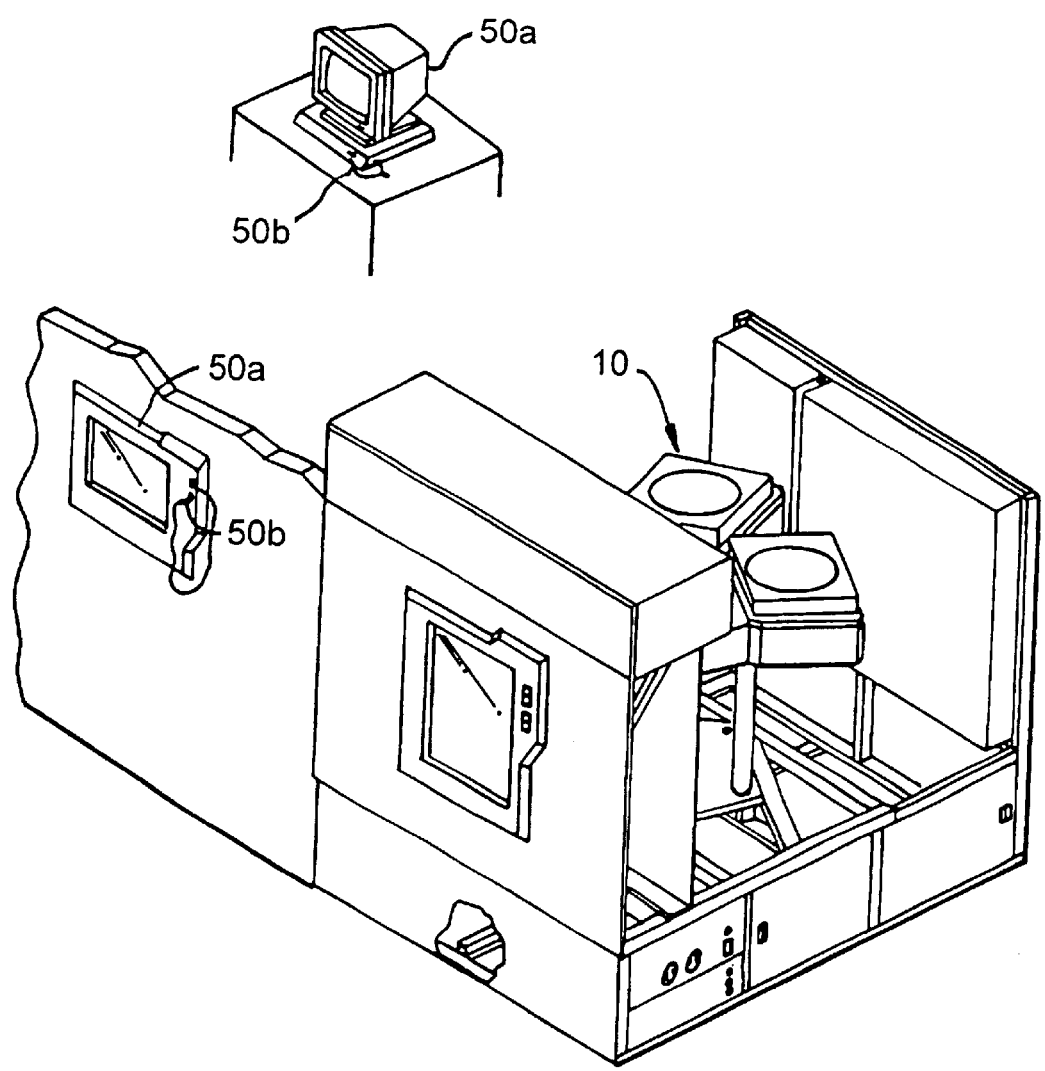
FIG. 1E is a simplified diagram of system monitor and CVD system in a multichamber system, which may include one or more chambers.

The interface between a user and the controller 34 is via a CRT monitor 50a and light pen 50b, shown in FIG. 1E, which is a simplified diagram of the system monitor and CVD system 10 in a substrate processing system, which may include one or more chambers. In the preferred embodiment two monitors 50a are used, one mounted in the clean room wall for the operators and the other behind the wall for the service technicians. The monitors 50a simultaneously display the same information, but only one light pen 50b is enabled. A light sensor in the tip of light pen 50b detects light emitted by CRT display. To select a particular screen or function, the operator touches a designated area of the display screen and pushes the button on the pen 50b. The touched area changes its highlighted color, or a new menu or screen is displayed, confirming communication between the light pen and the display screen. Other devices, such as a keyboard, mouse, or other pointing or communication device, may be used instead of or in addition to light pen 50b to allow the user to communicate with controller 34.

Figure 2:
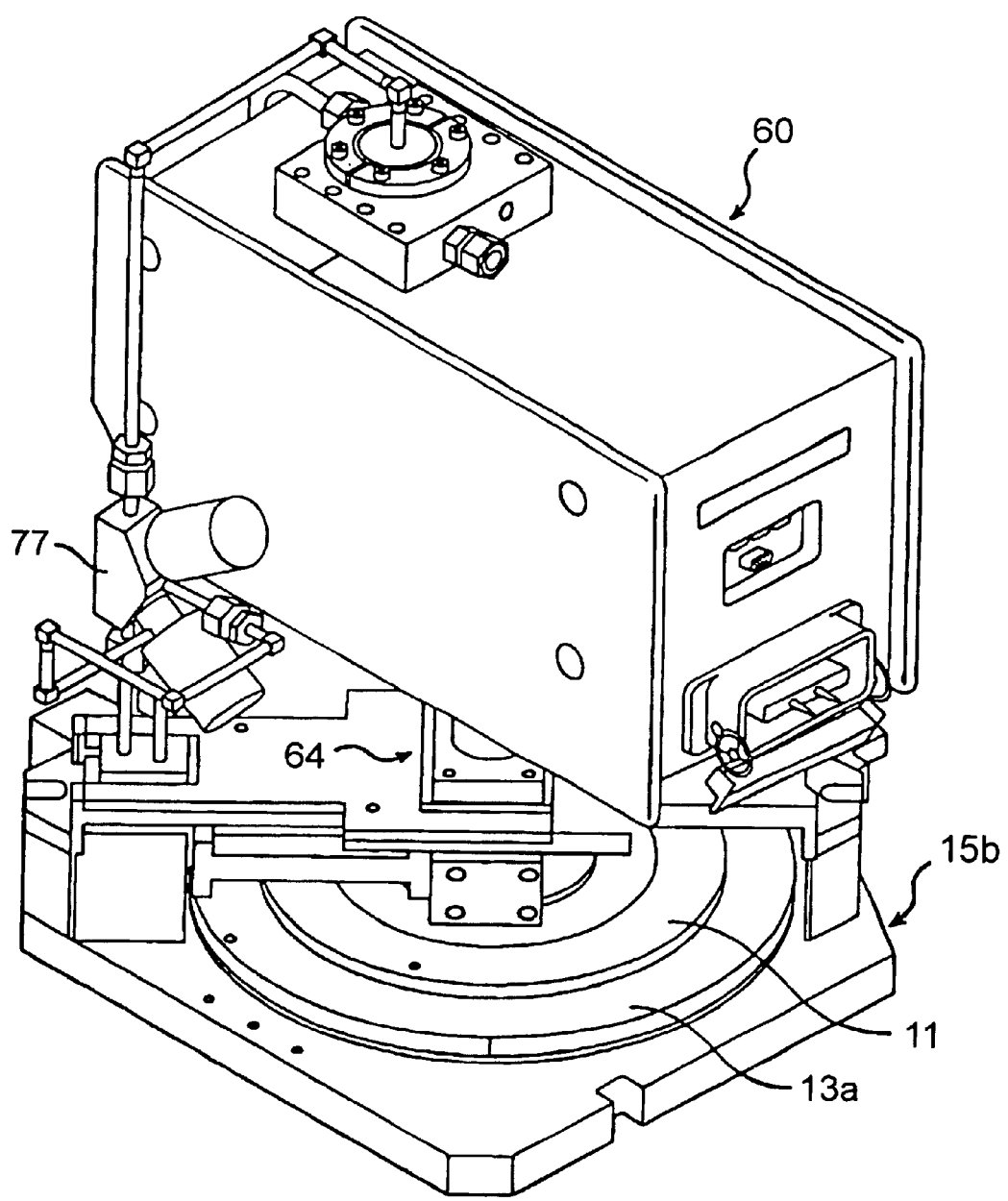
FIG. 2 is a perspective view of the remote plasma generator mounted on the lid of the CVD chamber of FIG. 1A.
Figure 3A:
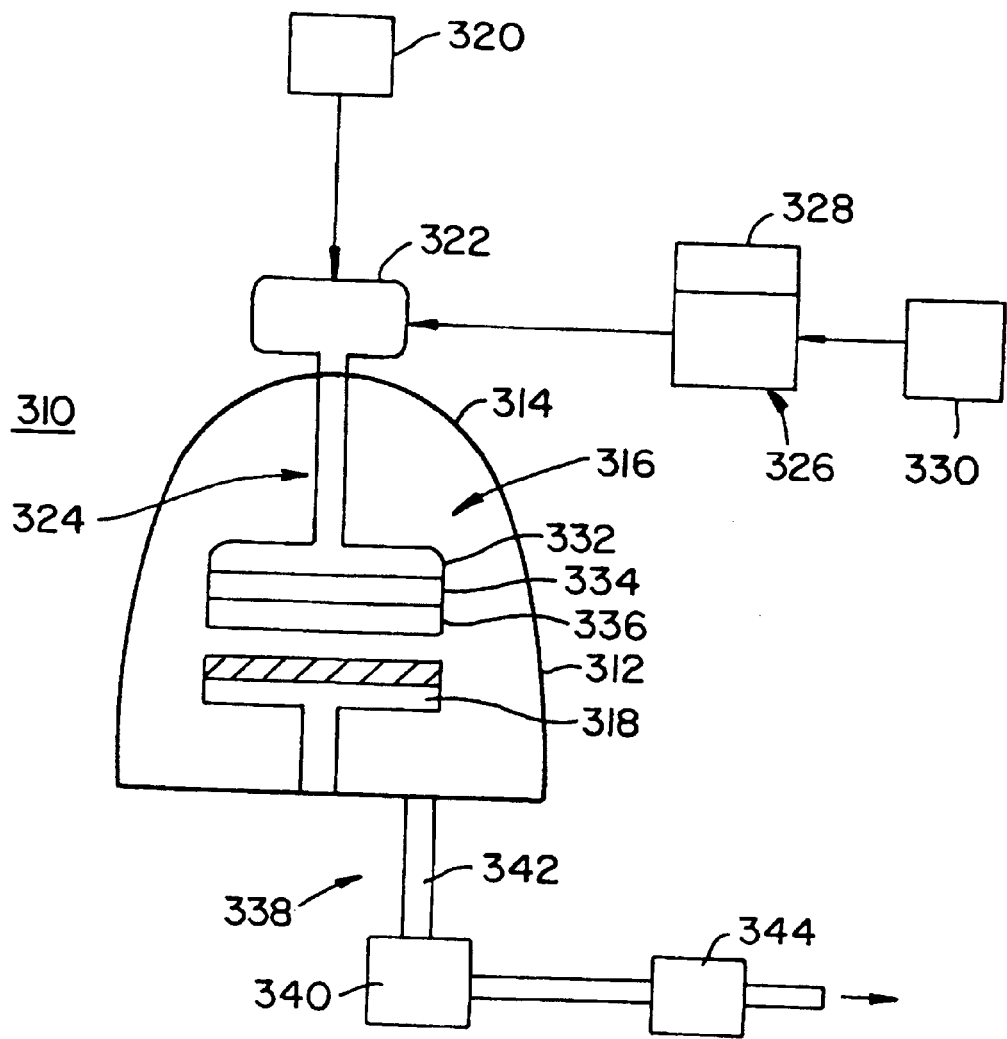
FIG. 3A is a simplified schematic view of a conventional CVD processing tool.
Figure 3B:
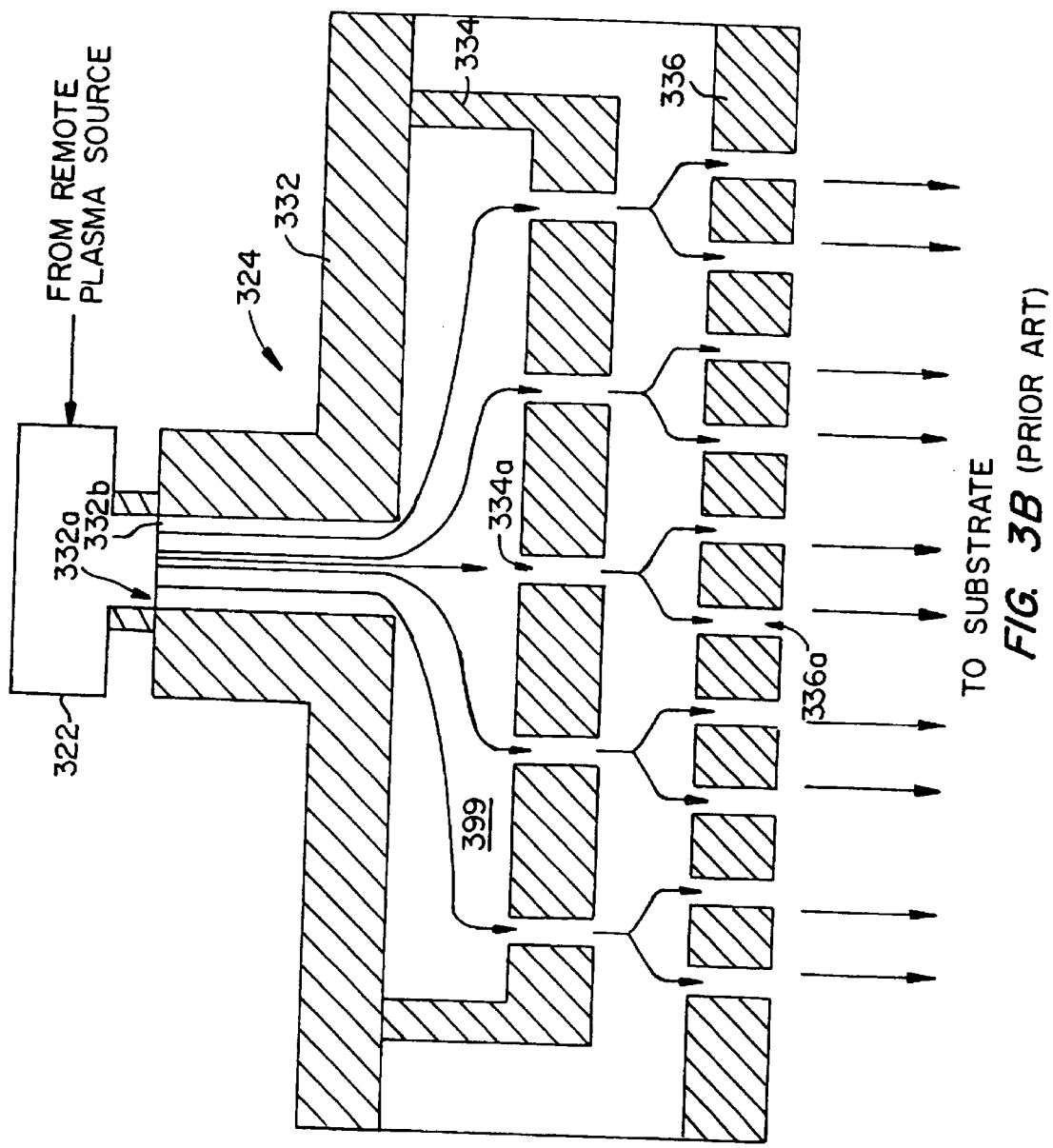
FIG. 3B is a simplified cross-sectional view of the conventional gas distribution system shown in FIG. 3A.

FIGS. 1A and 2 show a remote plasma generator 60 mounted on the lid assembly 15b of the process chamber 15 including the gas distribution faceplate 13a and the gas distribution manifold 11. A mounting adaptor 64 mounts the remote plasma generator 60 on the lid assembly 15b, as best seen in FIG. 1A. The adaptor 64 is typically made of metal. A mixing device 70 is coupled to the upstream side of the gas distribution manifold 11 (FIG. 1A). The mixing device 70 includes a mixing insert 72 disposed inside a slot 74 of a mixing block for mixing process gases. A ceramic isolator 66 is placed between the mounting adaptor 64 and the mixing device 70 (FIGS. 1A). The ceramic isolator 66 is made of a ceramic material such as $Al_2O_3$ (99% purity), Teflon™, or the like. When installed, the mixing device 70 and ceramic isolator 66 form part of the lid assembly 15b. The isolator 66 isolates the metal adaptor 64 from the mixing device 70 and gas distribution manifold 11 to minimize the potential for a secondary plasma to form in the lid assembly 15b as discussed in more detail below. As shown in FIG. 2, a three-way valve 77 controls the flow of the process gases to the process chamber 15 either directly or through the remote plasma generator 60.

The remote plasma generator 60 is desirably a compact, self-contained unit that can be conveniently mounted on the lid assembly 15b and be easily retrofitted onto existing chambers without costly and time-consuming modifications. One suitable unit is the ASTRON™ generator available from Applied Science and Technology, Inc. of Woburn, Mass. The ASTRON™ generator utilizes a low-field toroidal (LFT™) plasma to dissociate a process gas. In one example, the plasma dissociates a process gas including a fluorine-containing gas such as $NF_3$ and a carrier gas such as argon to generate free fluorine which is used to clean film deposits in the process chamber 15.

While the above is a complete description of specific embodiments of the present invention, various modifications, variations, and alternatives may be employed. These equivalents and alternatives are included within the scope of the present invention. Therefore, the scope of this invention is not limited to the embodiments described, but is defined by the following claims and their full scope of equivalents.

What is claimed is:

1. A gas distribution system for a substrate processing chamber, the gas distribution system comprising:

a gas distribution faceplate having a first plurality of gas holes adapted to introduce a gas into the substrate processing chamber;

a first gas inlet having a cross-sectional area smaller than the surface area of the substrate;

a first gas passageway fluidly coupled to the first gas inlet and to the first plurality of gas holes, wherein the first gas passageway comprises a second plurality of gas holes configured to transform a flow of gas from the first gas inlet into a flow of gas having the cross-section of the surface area of the substrate;

a second gas inlet; and a second gas passageway fluidly coupled to the second gas inlet and to the first plurality of gas holes, wherein the second gas passageway allows gases to flow from the second gas inlet to the first plurality of gas holes, while by-passing the second plurality of holes.

2. The gas distribution system of claim 1 wherein the second plurality of holes are fewer in number than the first plurality of holes.

3. The gas distribution system of claim 1 wherein the first gas passageway comprises a perforated plate, and the second gas passageway extends beyond an edge of the perforated plate.

4. The gas distribution system of claim 3 wherein the perforated plate is circular and the second gas passageway extends in a radial direction.

5. The gas distribution system of claim 1 wherein the second inlet and the second gas passageway are defined by the interface between a first integral element housing the first inlet and a by-pass plate attached to the first integral element.

6. The gas distribution system of claim 1 wherein the first inlet, the second inlet, and the second passageway are defined by a single integral element.

7. The gas distribution system of claim 1 wherein the second gas passageway is also in fluid communication with the first plurality of holes.

8. A gas distribution system for a semiconductor fabrication chamber comprising:

a gas box having a first channel in fluid communication with a processing gas source and a second channel in fluid communication with a remote plasma source;

a blocker plate defining a plurality of orifices in fluid communication with the first inlet of the gas box;

a gas distribution faceplate defining a plurality of orifices in fluid communication with the orifices of the blocker plate and in fluid communication with a chamber of a processing tool; and a by-pass plate positioned between the gas box and the blocker plate, the by-pass plate having a first channel in fluid communication with the first channel of the gas box and with the blocker plate orifice, the by-pass plate including a second channel in fluid communication with the second gas box channel, the second channel of the by-pass plate in fluid communication with the chamber without passing through the blocker plate orifice.

9. The gas distribution system of claim 8 wherein the second channel of the by-pass plate is in direct fluid communication with the chamber.

10. The gas distribution system of claim 8 wherein the second channel of the by-pass plate is in fluid communication with the chamber through the orifice in the gas distribution face plate.

11. The gas distribution system of claim 10 wherein the second channel of the by-pass plate extends in a radial direction to define an outlet positioned beyond an outside edge of the blocker plate.

12. The gas distribution system of claim 8 wherein the second channel of the by-pass plate is also in fluid communication with the first channel of the by-pass plate.

13. A gas distribution system for a semiconductor fabrication chamber comprising:

a gas box including, a first channel including an outlet and an inlet in fluid communication with a processing gas source, and a second channel including an outlet and an inlet in fluid communication with a remote plasma source;

a blocker plate defining a plurality of orifices in fluid communication with the first gas box channel outlet; and a gas distribution faceplate defining a plurality of orifices in fluid communication with the orifices of the blocker plate and with the processing chamber.

14. The gas distribution system of claim 13 wherein the second channel of the by-pass plate is in direct fluid communication with the chamber.

15. The gas distribution system of claim 13 wherein the second channel of the by-pass plate is in fluid communication with the chamber through the orifice in the gas distribution face plate.

16. The-gas distribution system of claim 13 wherein the second channel of the gas box extends in a radial direction to define the outlet positioned beyond an outside edge of the blocker plate.

17. The gas distribution system of claim 13 wherein the second channel of the gas box is also in fluid communication with the first channel of the gas box.

\* \* \* \* \*